(12) United States Patent
Lin et al.

(10) Patent No.: US 6,830,496 B2
(45) Date of Patent: Dec. 14, 2004

(54) METHOD OF FABRICATING LIGHT EMITTING DIODE DEVICE WITH MULTIPLE ENCAPSULANTS

(75) Inventors: Ting-Hao Lin, Taipei (TW); Li-Wei Kuo, Taipei (TW); Ching-Lin Chang, Kinmen Hsien (TW)

(73) Assignee: Kaylu Industrial Corporation, Taoyuan (TW)

( * ) Notice: Subject to any disclaimer, the term of this patent is extended or adjusted under 35 U.S.C. 154(b) by 0 days.

(21) Appl. No.: 10/349,242

(22) Filed: Jan. 22, 2003

(65) Prior Publication Data

US 2004/0140764 A1 Jul. 22, 2004

(51) Int. Cl.⁷ .................................................. H01J 9/00
(52) U.S. Cl. .......................................... 445/49; 445/50
(58) Field of Search ................................ 445/49–51, 24, 445/25; 313/512; 257/98, 99, 10

(56) References Cited

U.S. PATENT DOCUMENTS 5,698,866 A * 12/1997 Doiron et al. ................ 257/99
6,345,903 B1 * 2/2002 Koike et al. ................ 362/249

* cited by examiner

*Primary Examiner*—Joseph Williams
(74) *Attorney, Agent, or Firm*—William E. Pelton, Esq.

(57) ABSTRACT

A light emitting diode device comprises a copper substrate having multiple light emitting regions, multiple dies and encapsulation. Each light emitting region has a die pad and at least one electrode connected together and encapsulant covering the light emitting region. The dies are respectively mounted on the die pads and are wire bonded to the corresponding electrode or electrodes. A step defining a gap is applied to the substrate to form multiple light emitting regions, and each light emitting region has a die pad and electrodes. Therefore, the present invention can simplify the steps for fabricating die pad and electrodes to increase the production rate of LED devices or LED display modules.

12 Claims, 9 Drawing Sheets

METHOD OF FABRICATING LIGHT EMITTING DIODE DEVICE WITH MULTIPLE ENCAPSULANTS

BACKGROUND OF THE INVENTION

1. Field of the Invention

The present invention relates to a method of fabricating a light emitting diode (LED), and more specifically to a simple method of simultaneously fabricating multiple LED devices in a single procedure.

2. Description of Related Art

With reference to FIG. 9, a conventional lead package for an LED device before applying the encapsulant includes a first lead (71), a second lead (72) and a die (73). The second lead (72) has a top face (not numbered), and a reflecting taper tube (720) is formed on the top face. The die (73) mounted in the reflecting taper tube (720) is connected between the first and second leads (71, 72) by a wire bonding process. After the wire bonding process, the die (73), and the first and second leads (71, 72) are encapsulated with encapsulant to form a completed LED device product.

The forgoing LED device has many drawbacks.

(1) The LED device only has one color. If the LED device has two colors, the LED device needs another lead.

(2) The fabricating process of the LED device is complex. That is, the fabricating process comprises at least a fabricating lead step, a mounting the die step, a wire bonding step and an encapsulating step. The encapsulating step requires a mold so the production rate for these LED devices is not very large.

(3) Combining the LED device with a PCB has very tedious steps, such as inserting the leads into correct conducting holes on the PCB, soldering the lead and the conducting hole and cutting off any excess portion of the lead.

(4) The LED device is hard to assemble into a display module. The LED device uses the leads to hold the die so assembling multiple LED devices into a display module is not easy.

Based on the forgoing description, the production rate of the lead package of the LED device is low, and attaching the led package to a PCB is not easy. Therefore, a surface mounted technology (SMT) LED device was developed. With reference to FIG. 10, the conventional SMT LED device has a substrate (86), two electrodes (81,82) and a die (83). The substrate (80) has two opposite ends (not numbered) and a top face (not numbered). The two electrodes (81, 82) are formed respectively on the opposite ends of the substrate (80). The die (83) is deposited on the substrate (80) and is connected to the two electrodes (81, 82) by a wire bonding process. After the wire bonding process, encapsulant (84) is applied to the top face of the substrate (80) with the die (83) to complete the SMT LED device. The SMT LED devices can be easily assembled into an LED display module by mounting more dies (83) on the substrate (80). In addition, the SMT LED device can be soldered quickly on the PCB to improve the production rate.

The steps to fabricate the SMT LED device are simpler than those required to fabricate the conventional LED device. However, some steps can be further improved to simply the steps in the SMT LED fabricating process.

The present invention provides a simple method of fabricating multiple LED devices simultaneously.

SUMMARY OF THE INVENTION

An objective of the present invention is to provide a method with simple steps of fabricating LED devices to increase the production rate.

Another objective of the present invention is to provide a method to selectively fabricate a one color LED device or an LED display module with multiple colors.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
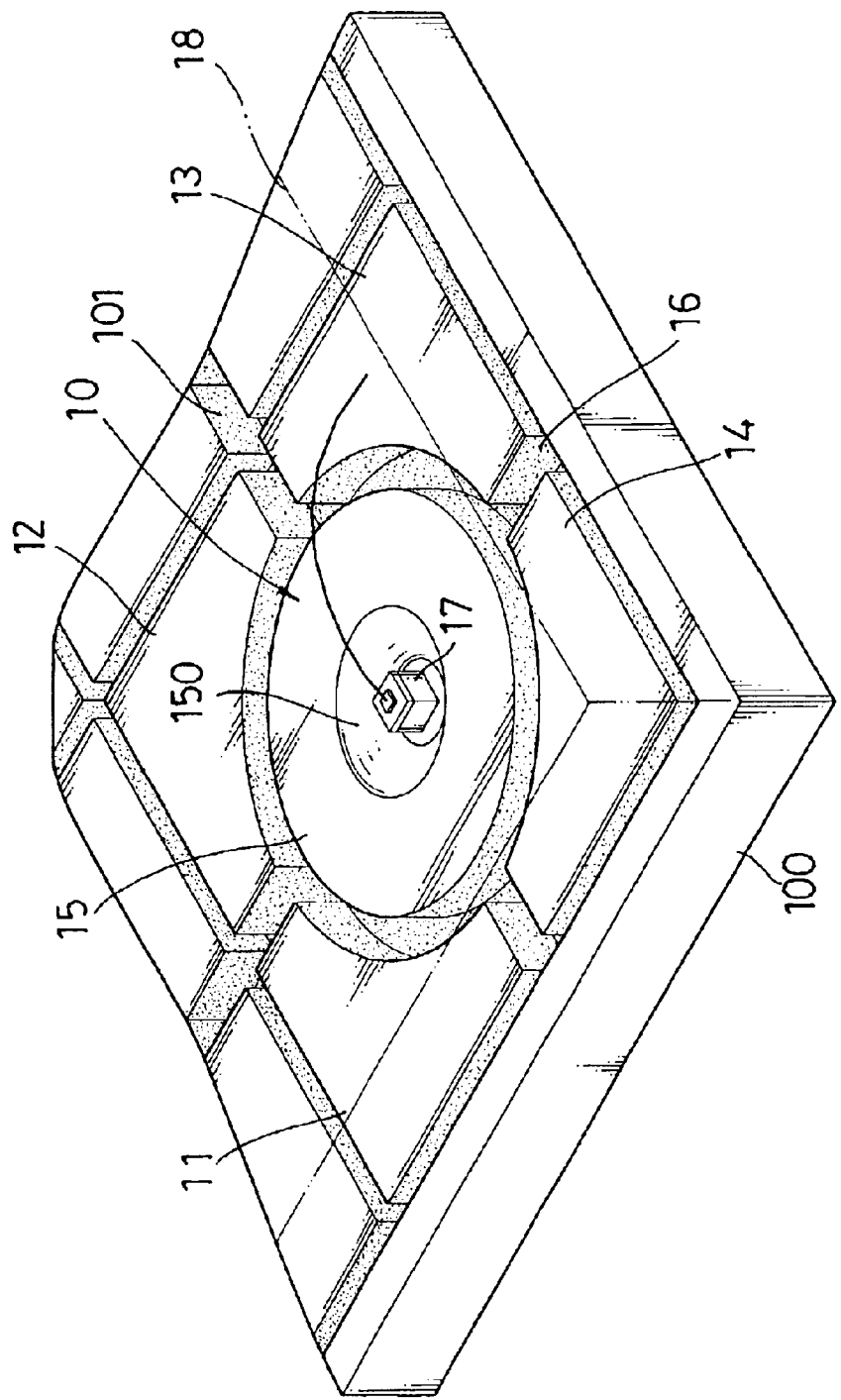
FIG. 1 is a perspective view of a single color LED device in accordance with the present invention.
Figure 2A:
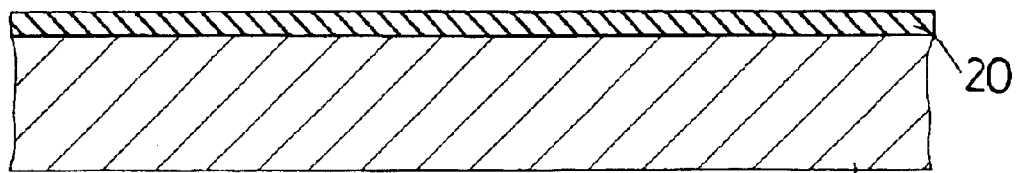
FIGS. 2A to 2D are side plan views of a substrate depicting the sequential states during the process of forming a first gap in the substrate in accordance with the present invention.
Figure 2B:
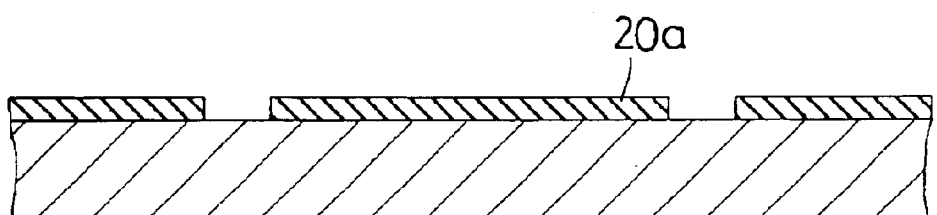
Figure 2C:
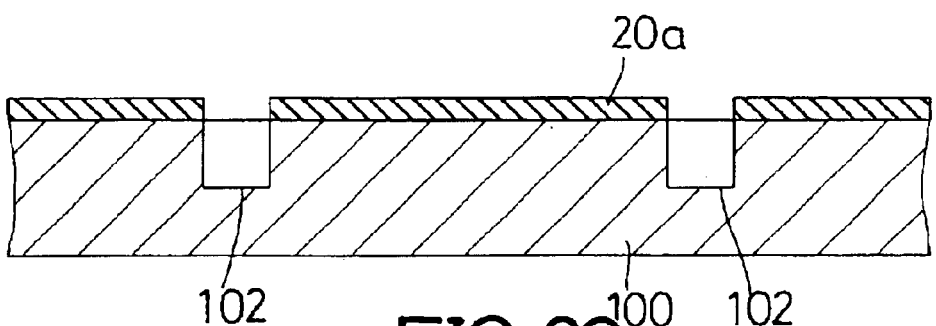
Figure 2D:
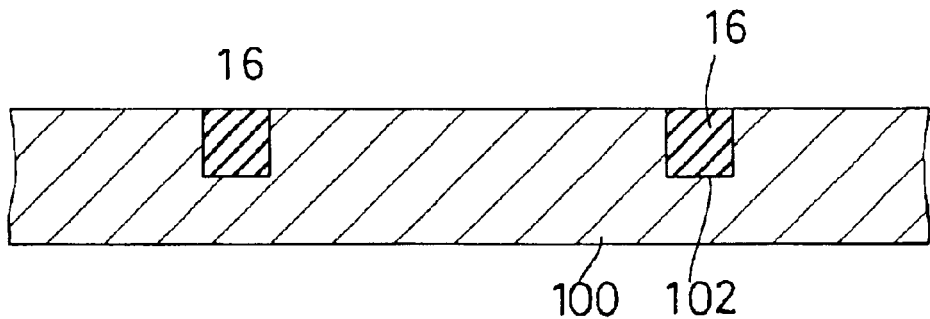

With reference to FIG. 1, an LED display module includes a copper substrate (100), multiple dies (17) and an outer encapsulant (18). The substrate (100) has a top face (not numbered) and a bottom face (not numbered). The dies (17) are respectively mounted on the top face of the substrate (100). The outer encapsulant (18) is applied to the top face of the substrate (100) and covers the dies (17).

Figure 8:
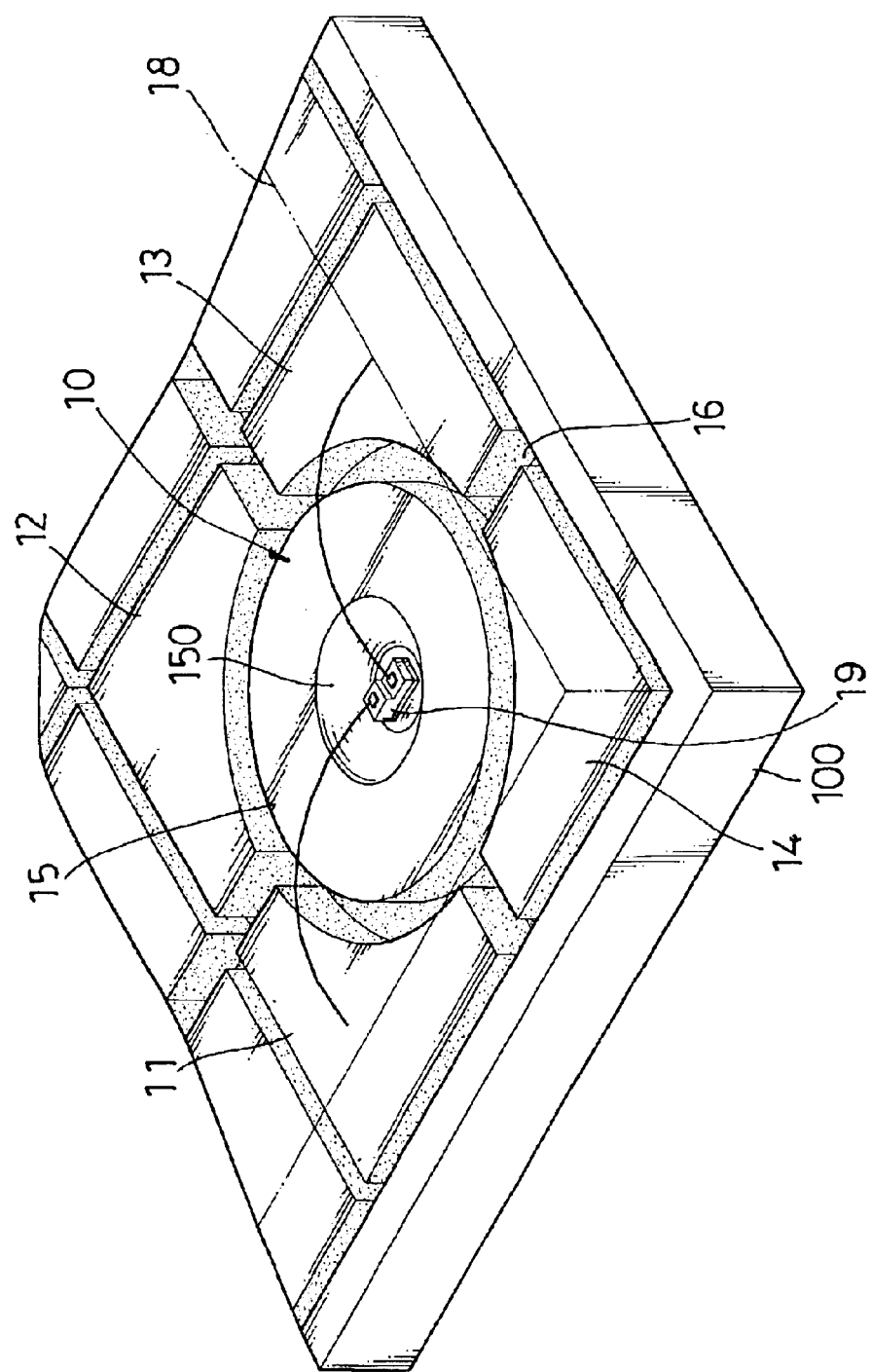
FIG. 8 is a perspective view of the dual color LED in FIG. 7A.
Figure 9:
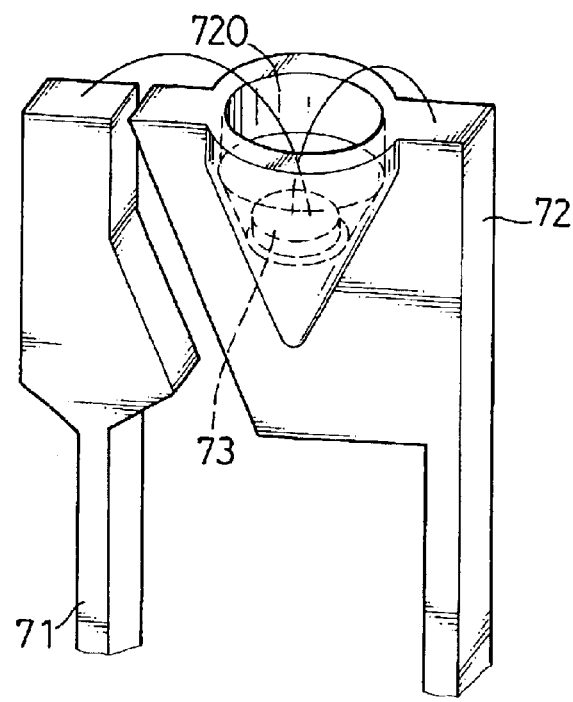
FIG. 9 is a perspective view of a conventional LED device with a lead package in accordance with the prior art.
Figure 10:
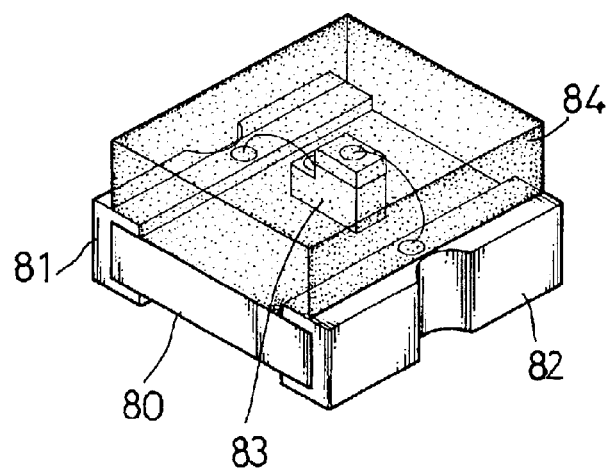
FIG. 10 is a perspective view of a conventional SMT LED device in accordance with the prior art.

The substrate (100) has multiple light emitting regions (10) formed into a matrix (not shown). Each light emitting region (10) has a die pad (15) and four electrodes (11 to 14). A gap (101) is defined at joints between adjacent light emitting regions (10), the die pad (15) and the electrodes (11,12,13,14) and adjacent electrodes (11-12, 12-13, 13-14, 11-14) and is filled with inner encapsulant (16). A die (17) is mounted on each die pad (15) and is connected to the corresponding electrode (13) by a wire bonding process. The outer encapsulant (18) covers the top face of the substrate (100), the die (17) and the wires (not numbered) to complete the LED display module. The LED display module can be cut along the gap (101) between adjacent light emitting regions (10) to for an LED device with as few as a single LED or as many LED devices as desired. The die (17) is a single color die with two terminals (not numbered). One terminal is connected directly to the die pad (15) and the other is connected to the electrode (13) by the wire, so the die pad (15) and the electrode (13) of the LED device can be soldered to corresponding conductive holes on a PCB. With reference to FIG. 8, a dual color die (19) has three terminals respectively connected to the die pad (15) and two electrodes (11,13).

A method for fabricating LED display module has steps of (a) providing a copper substrate having a top face and a bottom face; (b) recessing a gap in the substrate to form multiple light emitting regions, wherein each light emitting region has a die pad and at least one electrode; (c) mounting one die on each die pad; (d) connecting each die to the corresponding electrodes; and (e) encapsulating the top face of the substrate with the dies.

With reference to FIGS. 2A to 2D, the step (b) includes a process of defining a first gap pattern (102) and a process of defining a corresponding second gap pattern (103) (103 is not found in FIG. 2). In the process of defining the first gap pattern (102), a photoresist (20) is applied to the top face of the substrate (100). The photoresist (20) is processed by an exposure and development process with a first gap pattern mask (not shown) to form a first gap pattern photoresist (20a). The top face of the substrate (100) is etched to form the first gap pattern (102) with the first gap pattern photoresist (20a). Then the first gap pattern photoresist (20) is removed. Inner encapsulant (16) fills the first gap pattern (102) recessed on the top face of the substrate (100).

Figure 5A:
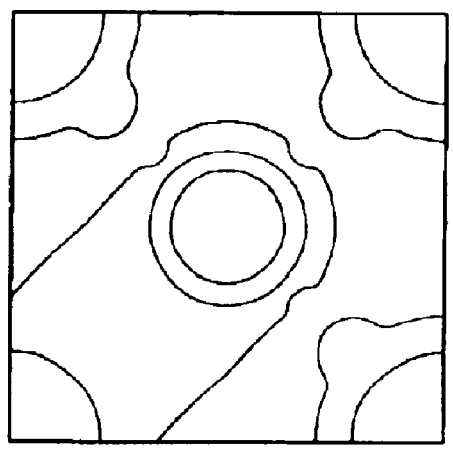
FIGS. 5A and 5B are top views of alternative pattern masks used with the method of fabricating an LED device in accordance with the present invention.
Figure 5B:
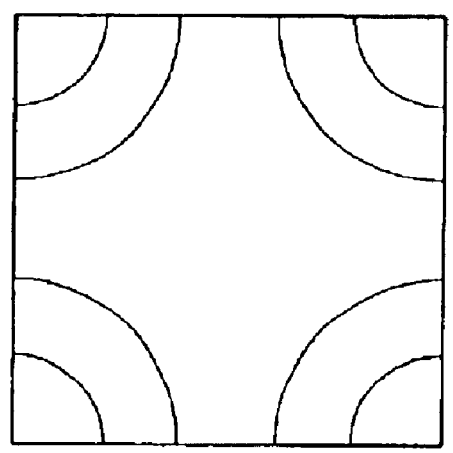
Figure 6:
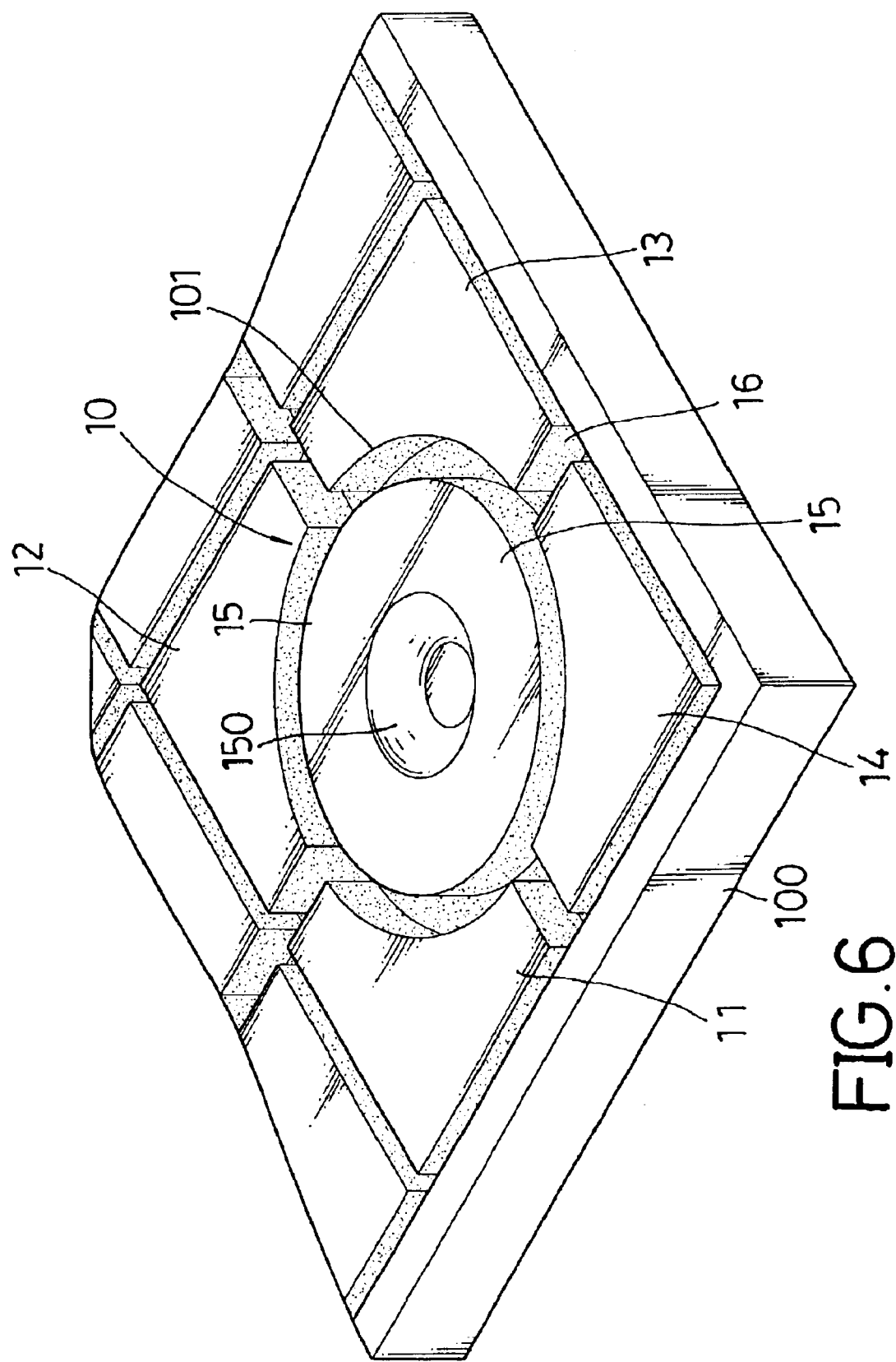
FIG. 6 is a perspective view of a copper substrate of an LED device in accordance with the present invention.

With reference to FIGS. 3A to 3D, the process of defining the second gap pattern to the substrate (100) is carried out by reversing the substrate (100) and applying photoresist (30) to the bottom face of the substrate (100). The photoresist (30) is also processed to form a second gap pattern photoresist (30a) by the exposure and development process with a second gap pattern mask. A second gap pattern (103) is formed on the bottom face of the substrate (100) by etching the bottom face with the gap second pattern photoresist (30a) to the depth of the inner encapsulant (16) in the first gap pattern (102). With further reference to FIG. 6, the first gap pattern (102) on the top face and the second gap pattern (103) on the bottom face communicate with each other to define the gaps (101) in the substrate (100). With reference to FIGS. 5A and 5B, the gap pattern mask can be other patterns.

Figure 3A:
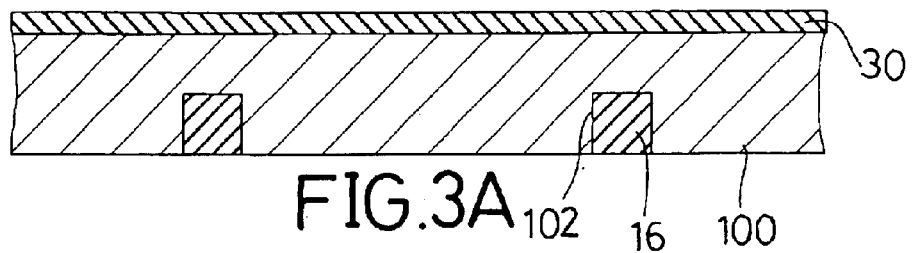
FIGS. 3A to 3E are side plan views of a substrate with a first gap depicting the sequential states during the process of forming a second gap corresponding to the first gap in the substrate in accordance with the present invention.
Figure 3B:
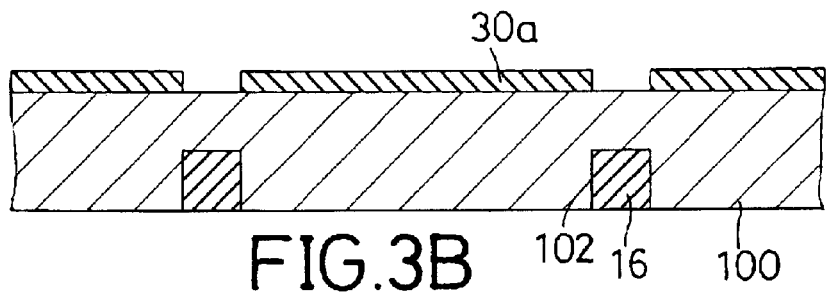
Figure 3C:
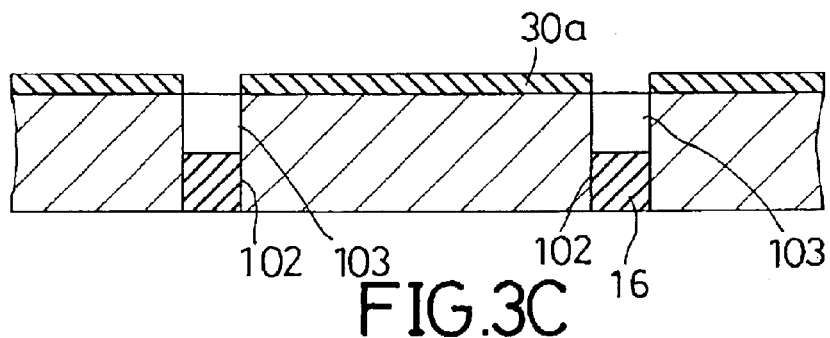
Figure 3D:
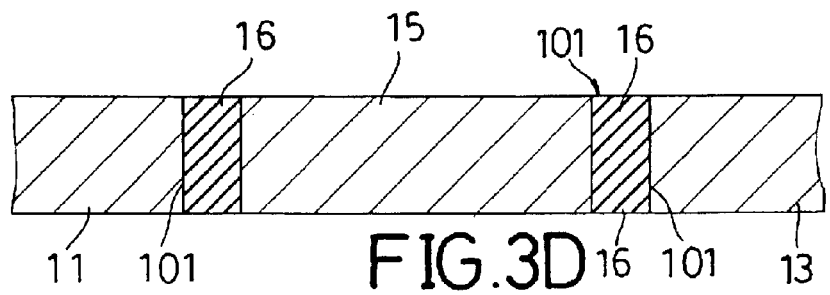
Figure 3E:
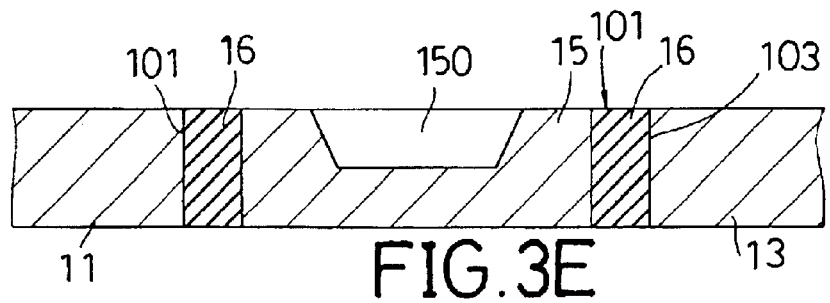

Inner encapsulant (16) also fills the second gap pattern (103) on the bottom face so the gap (101) is completely filled with inner encapsulant (16). Therefore, the substrate (100) has multiple light emitting regions (10) and each emitting region (10) has a die pad (15) and multiple electrodes (11, 12, 13, 14), which are electrically isolated from each other. With reference to FIG. 3E, each die pad (15) is further etched to define a die recess (150). The first and second gap patterns (102, 103) on the top and bottom face are symmetrical so the step of defining the die recess can be first executed in the process of defining the first gap pattern.

Figure 4A:
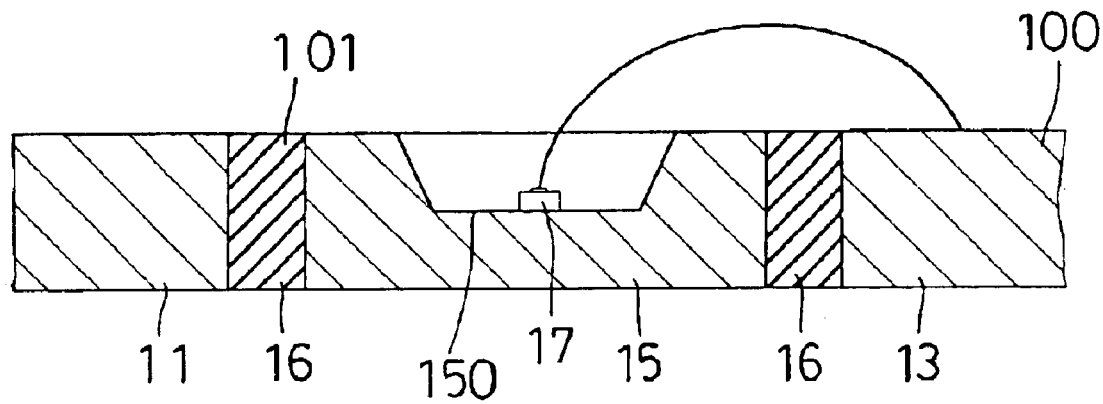
FIGS. 4A and 4B are cross sectional side plan views of a single color LED device in accordance with the present invention before and after the application of an outer encapsulant.
Figure 4B:
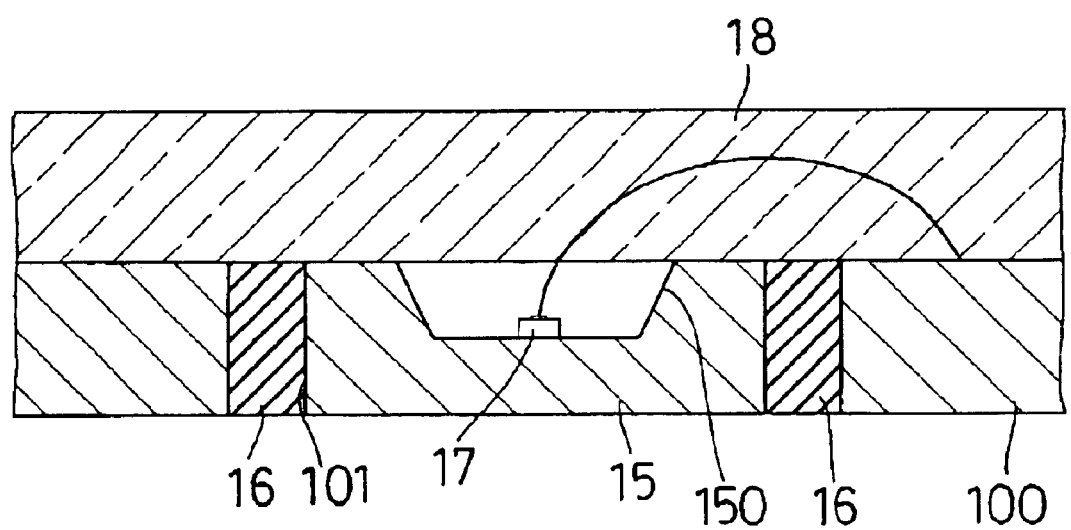

With reference to FIG. 4A, steps (c) and (d) are further executed after the second gap pattern defining process. That is, the dies (17) are mounted in the corresponding die recess (150) on the die pad (15) and connected to the corresponding electrode (13). With reference to FIG. 4B, step (e) includes the application of outer encapsulant (18) on the top face of the substrate (100).

Figure 7A:
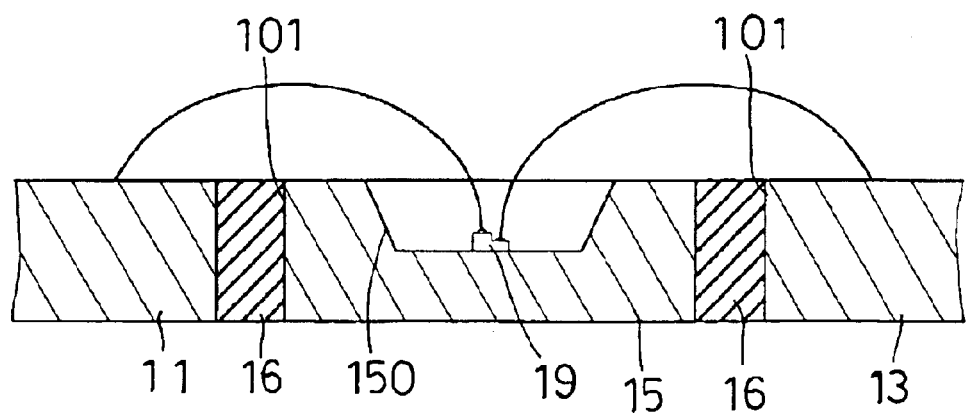
FIGS. 7A and 7B are cross sectional side plan views of a dual color LED in accordance with the present invention before and after the application of an encapsulant.
Figure 7B:
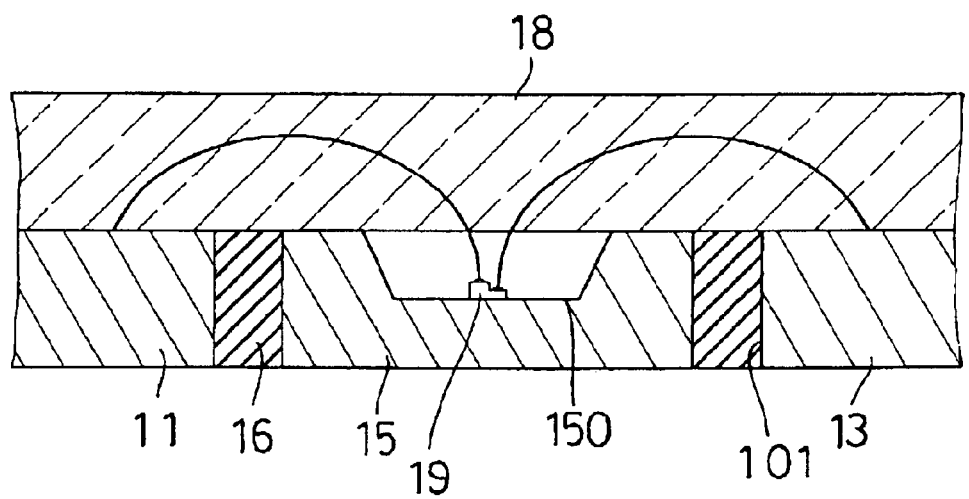

With reference to FIG. 7A, a dual color die (19) is mounted in the corresponding die pad (15) and connected to two electrodes (11,13) by two wires (not numbered). With reference to FIG. 7B, outer encapsulant (18) is applied to the top face of the substrate (100) with the dual color dies (19).

The forgoing method further includes a step of cutting the substrate (100) with the outer encapsulant (18). With reference to FIG. 6, the substrate (100) with the outer encapsulant (18) is cut along the gap (101) between adjacent light emitting regions (10) to separate an individual LED device.

Based on the forgoing description, the invention has the following advantages:

(1) The substrate has multiple light emitting regions so that the present invention can fabricate not only an LED display module but also an LED device.

(2) The present invention has simple fabricating steps. Two pattern processes can be applied to one substrate to form multiple light emitting regions. In addition, each light emitting region includes one die pad and corresponding electrodes, so the die pad and the appropriate electrode or electrodes connected to the die are soldered to a PCB.

(3) The present invention can increase the production rate of LED products. Exposure and development procedures are used in the steps to process the substrate so that the density of the LED devices on the substrate is very high. Meanwhile, production rate of the LED products is increased.

(4) The LED display module with a specific display function can be implemented by interconnecting electrodes of different light emitting regions.

(5) The present invention has high thermal conductivity since the substrate is made of the copper material.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for fabricating light emitting diode devices with multiple encapsulants comprising:

providing a copper substrate, wherein the substrate has a top face and a bottom;

defining a gap in the substrate with an inner encapsulant in the gap, wherein the substrate is separated by the gap to multiple light emitting regions and each light emitting region has one die pad and at least one electrode;

mounting one die on each die pad and wire bonding the die to one of the at least one electrode; and applying an outer encapsulant on the top face of the substrate including the dies.

2. The method as claimed in claim 1, wherein the defining step further comprises steps of:

recessing a first gap pattern on the top face, wherein inner encapsulant fills the first gap pattern; and recessing a second gap pattern on the bottom face, wherein the second gap pattern communicates with the first gap pattern and is filled with inner encapsulant.

3. The method as claimed in claim 2, wherein the recessing the first gap pattern step further comprises steps of:

applying a first photoresist on the top face;

transforming the first photoresist to a first gap pattern photoresist by an exposure and development process with a first gap pattern mask;

etching the top face covered under the first gap pattern photoresist to recess the first gap pattern on the top face; and removing the first gap pattern photoresist from the top face.

4. The method as claimed in claim 3, wherein the recessing the second gap pattern step further comprises steps of:

applying a second photoresist on the bottom face;

transforming the second photoresist to a second gap pattern photoresist by exposure and development procedure with a second gap pattern mask, wherein the first and second gap pattern masks are symmetrical;

etching the bottom face covered under the second gap pattern photoresist to recess the second gap pattern on the bottom face, wherein the second gap pattern communicates with the first gap pattern to define the gaps; and removing the second gap pattern photoresist from the bottom face.

5. The method as claimed in claim 3 further comprising a step of defining a die recess on the die pad for holding one die after the removing the first gap pattern photoresist step.

6. The method as claimed in claim 4 further comprising a step of defining a die recess on the die pad for holding one die after the removing the second gap pattern photoresist step.

7. The method as claimed in claim 1 further comprising a step of cutting the substrate with the outer encapsulant step after the applying the outer encapsulant step, wherein the substrate with the outer encapsulant is cut along the gap at joints between adjacent light emitting regions.

8. The method as claimed in claim 2 further comprising a step of cutting the substrate with the outer encapsulant step after the applying the outer encapsulant step, wherein the substrate with the outer encapsulant is cut along the gap at joints between adjacent light emitting regions.

9. The method as claimed in claim 3 further comprising a step of cutting the substrate with the outer encapsulant step after the applying the outer encapsulant step, wherein the substrate with the outer encapsulant is cut along the gap at joints between adjacent light emitting regions.

10. The method as claimed in claim 4 further comprising a step of cutting the substrate with the outer encapsulant step after the applying the outer encapsulant step, wherein the substrate with the outer encapsulant is cut along the gap at joints between adjacent light emitting regions.

11. The method as claimed in claim 5 further comprising a step of cutting the substrate with the outer encapsulant step after the applying the outer encapsulant step, wherein the substrate with the outer encapsulant is cut along the gap at joints between adjacent light emitting regions.

12. The method as claimed in claim 6 further comprising a step of cutting the substrate with the outer encapsulant step after the applying the outer encapsulant step, wherein the substrate with the outer encapsulant is cut along the gap at joints between adjacent light emitting regions.

\* \* \* \* \*